(12) United States Patent
Lin et al.

(10) Patent No.: US 12,550,261 B2
(45) Date of Patent: Feb. 10, 2026

(54) PACKAGE STRUCTURE WITH INDUCTOR, AND MANUFACTURING METHOD THEREOF

(71) Applicant: JCET GROUP CO., LTD., Jiangsu (CN)

(72) Inventors: Yaojian Lin, Wuxi (CN); Chenye He, Wuxi (CN); Shuo Liu, Wuxi (CN); Danfeng Yang, Wuxi (CN); Li Zou, Wuxi (CN)

(73) Assignee: JCET GROUP CO., LTD., Jiangsu (CN)

( * ) Notice: Subject to any disclaimer, the term of this patent is extended or adjusted under 35 U.S.C. 154(b) by 338 days.

(21) Appl. No.: 18/268,867

(22) PCT Filed: May 19, 2021

(86) PCT No.: PCT/CN2021/094567
§ 371 (c)(1),
(2) Date: Jun. 21, 2023

(87) PCT Pub. No.: WO2022/134439
PCT Pub. Date: Jun. 30, 2022

(65) Prior Publication Data
US 2024/0057256 A1 Feb. 15, 2024

(30) Foreign Application Priority Data
Dec. 24, 2020 (CN) .......................... 202011547796.4

(51) Int. Cl.
*H05K 1/11* (2006.01)
*H05K 1/14* (2006.01)
(Continued)

(52) U.S. Cl.
CPC ............. *H05K 1/165* (2013.01); *H05K 1/111* (2013.01); *H05K 1/144* (2013.01); *H05K 3/103* (2013.01);
(Continued)

(58) Field of Classification Search
CPC ........ H05K 1/165; H05K 1/111; H05K 1/144; H05K 3/103; H05K 3/284; H05K 3/3457;
(Continued)

(56) References Cited

U.S. PATENT DOCUMENTS

2010/0264533 A1 10/2010 Chen
2015/0255431 A1 9/2015 Su et al.
(Continued)

FOREIGN PATENT DOCUMENTS

CN 101202151 A 6/2008
CN 201282142 Y 7/2009
(Continued)

OTHER PUBLICATIONS

International Search Report (PCT/ISA/210) issued in PCT/CN2021/094567, dated Sep. 27, 2021.

*Primary Examiner* — Binh B Tran
(74) *Attorney, Agent, or Firm* — Birch, Stewart, Kolasch & Birch, LLP

(57) ABSTRACT

The present invention provides a package structure with an inductor and a manufacturing method thereof, the inductor and the interconnection component are used as n second package module, and stacked with other components such as the first package module to form a stack-like package structure. The first package module is provided with other electronic elements. Then the first and second package modules can be synchronously subjected to package manufacturing, which improves the production efficiency. Additionally, the soldering balls with different heights are formed
(Continued)

on the first faces of the interconnecting structural component and the inductive device by adjusting the consumption of soldering paste, which make the second faces of the inductor and the interconnection component are coplanar, then inductor with different heights can form a flat interconnecting plane, which makes the sequential process such as pasting and mounting can be conveniently performed. The process is simplified, and the reliability of the package structure is improved.

24 Claims, 17 Drawing Sheets

(51) Int. Cl.
 *H05K 1/16* (2006.01)
 *H05K 3/10* (2006.01)
 *H05K 3/28* (2006.01)
 *H05K 3/34* (2006.01)
(52) U.S. Cl.
 CPC ........... *H05K 3/284* (2013.01); *H05K 3/3457* (2013.01); *H05K 2201/0715* (2013.01); *H05K 2201/0909* (2013.01); *H05K 2203/041* (2013.01)

(58) Field of Classification Search
 CPC ... H05K 2201/0715; H05K 2201/0909; H05K 2203/041
 USPC ......................................................... 361/760
 See application file for complete search history.

(56) References Cited

U.S. PATENT DOCUMENTS

| 2018/0261569 | A1* | 9/2018 | Yang | .................... H01L 25/0652 |
| 2019/0074267 | A1* | 3/2019 | Yang | ........................ H01L 25/16 |
| 2019/0088621 | A1* | 3/2019 | Yang | .................... H01L 25/0657 |
| 2020/0227393 | A1  | 7/2020 | Kim et al. | |

FOREIGN PATENT DOCUMENTS

| CN | 103035627 A | 4/2013 |
| CN | 103295986 A | 9/2013 |
| CN | 106816421 A | 6/2017 |
| CN | 107758604 A | 3/2018 |
| CN | 108305855 A | 7/2018 |
| CN | 111063674 A | 4/2020 |
| CN | 111415908 A | 7/2020 |
| CN | 211480019 U | 9/2020 |
| JP | 2008-71953 A | 3/2008 |
| TW | 200919684 A | 5/2009 |

\* cited by examiner

PACKAGE STRUCTURE WITH INDUCTOR, AND MANUFACTURING METHOD THEREOF

TECHNICAL FIELD

The present invention relates to a semiconductor package structure, and particularly relates to a package structure with an inductor and the manufacturing method thereof.

BACKGROUND

For large power module, large inductor has large Z height tolerance. However, a Z-axis height tolerance between the large inductors are relatively large (>100 um). In addition, the electrodes on the inductor are generally non-symmetric, and high unevenness module IO and non-symmetric electrodes are unfavorable for the surface-mounting of the circuit board. Besides, sequential process of double sides assembly is generally adopted by said large inductor and chips. The chips and inductors are sequentially pasted and mounted onto a front side and a back side of a base. The sequential process has longer cycle time, and is unfavorable for improving production efficiency.

SUMMARY

The purpose of the present invention is to provide a package structure with an inductor, and a manufacturing method thereof.

The present invention provides a package structure with an inductor. The package structure includes a first package module and a second package module independent from each other, and the first package module is stacked on the second package module. The first package module includes a first package carrier and an electronic element, the package carrier includes a first surface and a second surface opposite to each other. The electronic element is disposed on the first surface of the first package carrier, and the first package carrier is electrically connected to the second package module by soldering balls disposed on the second surface. The second package module includes an inductor and an interconnection component, each of the inductor and the interconnection component includes a first surface and a second surface opposite to each other, the inductor and the interconnection component are electrically connected with each other by the soldering balls on the first surface thereof, and the second surfaces of the inductor and the interconnection component are coplanar.

As a further improvement of the present invention, the inductor has A height, and is connected to the first package module by a number of first soldering balls, the first soldering balls have M height; the interconnection component has B height, and is connected to the first package module by a number of second soldering balls, the second soldering ball has N height, and A+M=B+N.

As a further improvement of the present invention, the inductor includes at least one electrode exposed to the first surface of the inductor to form a first bonding pad, the first soldering ball is electrically connected to the first bonding pad, and the inductor further includes at least one electrode exposed to the second surface of the inductor to form a second bonding pad.

As a further improvement of the present invention, the second bonding pad and the second surface of the interconnection component are provided with conductive bumps.

As a further improvement of the present invention, the second bonding pad and the second surface of the interconnection component are electrically connected to a second package carrier, at least one support component is disposed between the inductor and the second package carrier, and the support component and the inductor are in insulation connection.

As a further improvement of the present invention, the first package module is provided with a first plastic encapsulation layer, and the first plastic encapsulation layer covers the first surface of the first package carrier and the electronic element.

As a further improvement of the present invention, the first package module is narrower than the second package module, a capillary underfill is filled between the first package module and the second package module, and the capillary underfill at least covers the soldering balls and partial side surface of the first package module.

As a further improvement of the present invention, the second package module is further provided with a second plastic encapsulation layer, the first package module is narrower than the second package module, and the second plastic encapsulation layer covers the inductor, the interconnection component, the soldering balls and a side wall surface of the first package module.

As a further improvement of the present invention, the second package module is further provided with a second plastic encapsulation layer, the second plastic encapsulation layer at least covers the inductor and the interconnection component, and a capillary underfill is filled between the first package module and the second plastic encapsulation layer.

As a further improvement of the present invention, the second package module is further provided with a second plastic encapsulation layer, the second plastic encapsulation layer at least covers the inductor and the interconnection component, the width of the first package module and that of the second package module are equal, the first plastic encapsulation layer and the second plastic encapsulation layer cover the soldering balls together, and side surfaces of the second plastic encapsulation layer and the first plastic encapsulation layer are coplanar.

As a further improvement of the present invention, the package structure further includes a second plastic encapsulation layer, the second plastic encapsulation layer covers the inductor, the interconnection component, the first package carrier, the electronic element and the soldering balls.

As a further improvement of the present invention, there is a shielding film covering the outer side of the first package module, and the shielding film at least covers the upper side of the first package module.

As a further improvement of the present invention, the shielding film further covers a side surface of the first package module, and extends to cover the side surface of the second package module, and electrically connects with a number of third bonding pads of the interconnection component, the third bonding pads are exposed to the side surface of the second package module.

As a further improvement of the present invention, a metal wire or a metal post is disposed in the second plastic encapsulation layer surrounding the first package module, and the metal wire or the metal post electrically connects with the interconnection component and the shielding film covering the upper surface of the first package module.

As a further improvement of the present invention, the interconnection component is a conductive post, or a conductive post enclosed by insulative material and/or a conductive circuit, and a plurality of interconnection bonding pads are provided at the first surface of the interconnection component and the second surface of the interconnection component.

As a further improvement of the present invention, the interconnection component is in a plate shape, and has a vacant region for receiving the inductor, or the interconnection component is in a block shape, and a plurality of interconnection components are distributed to surround the inductor.

The present invention further provides a manufacturing method of a package structure with an inductor, and the manufacturing method includes the following steps:
providing a carrier or a carrier tape or a second package carrier, and pasting and mounting an inductor and an interconnection component onto the carrier or the carrier tape or the second package carrier to form a second package module;
coating solder paste on the inductor and the interconnection component, and adjusting the coating amount of the solder paste according to the heights of the inductor and the interconnection component;
disposing an electronic element provided with a chip and/or a passive component onto a first surface of a first package carrier to form a first package module, and planting soldering balls onto a second surface of the first package carrier;
placing the first package module onto the second package module, and performing reflow soldering; and
peeling off the carrier or the carrier tape, and cutting to obtain a single package structure with an inductor.

As a further improvement of the present invention, the manufacturing method further includes the steps:
filling a plastic material to cover the first surface of the first package carrier and the electronic element to form a first plastic encapsulation layer.

As a further improvement of the present invention, the manufacturing method further includes the following steps:
applying capillary underfill between the first package module and the second package module to at least cover the soldering balls and partial side surface of the first package module.

As a further improvement of the present invention, the manufacturing method further includes the following steps:
filling plastic material to cover the inductor, the interconnection component, the soldering balls and a side surface of the first package module to form a second plastic encapsulation layer.

As a further improvement of the present invention, the manufacturing method further includes the following steps:
filling plastic material to at least cover the inductor and the interconnection component to form a second plastic encapsulation layer, and applying capillary underfill between the first package module and the second plastic encapsulation layer.

As a further improvement of the present invention, the manufacturing method further includes the following steps:
filling plastic material to cover the inductor, the interconnection component, the first package carrier, the electronic element and the soldering balls to form a second plastic encapsulation layer.

As a further improvement of the present invention, the manufacturing method further includes the following steps:
plating an shielding film onto the first package module, wherein the shielding film at least covers the upper side of the first package module, and extends to cover the side surface of the second package module, and electrically connects with a number of third bonding pads of the interconnection component, the third bonding pads are exposed to the side surface of the second package module.

As a further improvement of the present invention, the manufacturing method further includes the following steps:
disposing a metal wire or a metal post at the peripheral side of the first package module, connecting the metal wire or metal post with the interconnection component, and then plating the shielding film onto the first package module and making the shielding film connect with the metal wire or the metal post.

As a further improvement of the present invention, said pasting and mounting the interconnection component specifically includes:
forming a vacant region in the plate-shaped interconnection component, pasting and mounting the interconnection component onto the carrier or the carrier tape or the second package carrier, and disposing the inductor in the vacant region.

As a further improvement of the present invention, said pasting and mounting the interconnection component specifically includes:
pasting and mounting the interconnection component in a block shape onto the carrier or the carrier tape or the second package carrier, the interconnection component surrounds the inductor.

As a further improvement of the present invention, said pasting and mounting the inductor and the interconnection component onto the second package carrier specifically includes:
forming conductive bumps on the inductor and the interconnection component, disposing a plurality of support components on the second surface of the inductor, and disposing the inductor and the interconnection component onto the second package carrier, and connecting the inductor and the interconnection component with the second package carrier by the conductive bumps and the support components.

The present invention has the beneficial effects that the inductor and the interconnection component are used as a second package module, and stacked with other components such as the first package module to form a stack-like package structure. Said first package module is provided with other electronic elements. Then the first and second package modules can be synchronously subjected to package manufacturing, which improves the production efficiency. Additionally, the soldering balls with different heights are formed on the first faces of the interconnecting structural component and the inductive device by adjusting the consumption of soldering paste, which make the second faces of the inductor and the interconnection component are coplanar, then inductor with different heights can form a flat interconnecting plane, which makes the sequential process such as pasting and mounting can be conveniently performed. The process is simplified, and the reliability of the package structure is improved.

DETAILED DESCRIPTION in order to describe the purpose, the technical solution and the advantages of this application more clearly, the technical solution of embodiments of this application will be clearly and completely described hereinafter with reference to specific implementations and corresponding accompanying drawings. Obviously, described implementations are only a part of implementations of this application, rather than all implementations. Based on the implementations in this application, all of other implementations obtained by a person of ordinary skill in the art without any creative effort shall belong to the protection scope of this application.

Implementations of the present invention are described below in detail, example of the implementations are shown in the accompanying drawings, and in the accompanying drawings, the same or similar symbols indicate same or similar components or components with the same or similar functions throughout the specification. The implementations described below with reference to the accompanying drawings are exemplary, are only for explaining the present invention, and should not be understood as limiting the present invention.

For convenience of description, it is described herein by using the term of expressing space relative positions, such as "upper", "lower", "rear" and "front" for describing a relationship of a unit or feature shown in the accompanying drawings relative to another unit or feature. The terms of relative space positions may include different orientations of devices in use or work other than orientations as shown in the figures. For example, if a device in a figure is turned over, it will be described as that a unit or feature located "under" or "above" another unit or feature will be located "under" or "above" another unit. Therefore, an exemplary term "under" may include two space orientations: upper and lower orientations.

Figure 1:
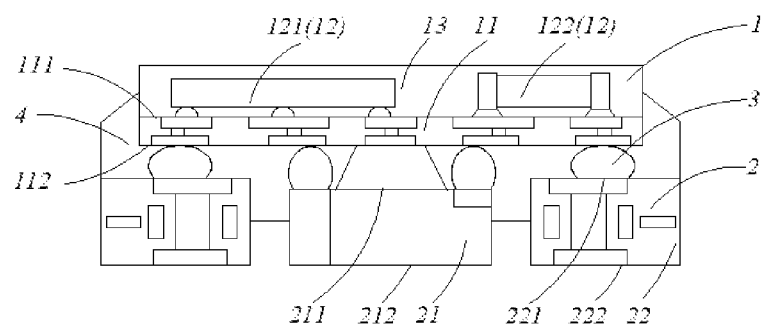
FIG. 1 is a schematic diagram of a package structure with an inductor in embodiment 1 of the present invention.

As shown in FIG. 1, the present invention provides a package structure with an inductor 21, the package structure includes a first package module 1 and a second package module 2 independent from each other, and the first package module 1 is stacked on the second package module 2.

The first package module 1 includes a first package carrier 11 and an electronic element 12, the package carrier includes a first surface and a second surface opposite to each other, the electronic element 12 is disposed on the first surface 111 of the first package carrier, and the first package carrier is electrically connected to the second package module 2 by soldering balls 3 disposed on the second surface.

The package carrier is a base, or a lead frame, or a laminated base, or a MIS (molded interconnect system) interconnection base, or a rewiring stacking layer, etc., and has a flat first surface and a flat second surface, and an electrically conductive circuit layer is disposed between the first surface and the second surface.

The electronic element 12 includes at least one chip 121, and an optional passive component 122. The passive component 122 is a common circuit device such as a capacitor and a resistor. The back side of the chip 121 may be exposed out of or embedded into a plastic material 13, and the heat dissipation capability can be improved by outward exposing the back side of the chip 121.

The second package module 2 includes an inductor 21 and an interconnection component 22, each of the inductor 21 and the interconnection component 22 includes a first surface and a second surface opposite to each other, the inductor 21 and the interconnection component 22 are electrically connected with each other by the soldering balls 3 on the first surface thereof, and the second surface 212 of the inductor 21 and the first surface 221 of the interconnection component 22 are coplanar. The second surfaces of the inductor 21 and the interconnection component 22 are respectively provided with bonding pads configured to connect with a circuit board or an electronic device.

The interconnection component 22 is a conductive post such as a copper post, or a conductive post and/or at least one layer of conductive circuit covered with a single-layer or multi-layer dielectric material. A plurality of interconnection bonding pads are provided at the first surface 221 and the second surface of the interconnection component 22, and the electrical conduction is realized by the interconnection component 22, and the effects of parts of circuit functions and structure support are achieved. The thermal expansion, modulus, density of wiring, size and density of guide hole, etc. of the interconnection component 22 can be adjusted to reach the required warping, heat conduction and electrical property.

Figure 2A:
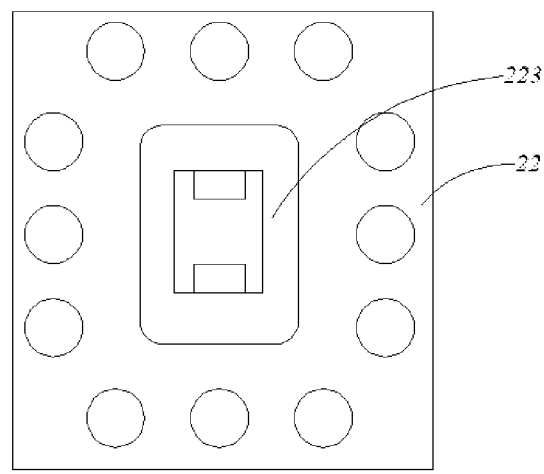
FIG. 2a and FIG. 2b are plane schematic diagrams of an interconnection component according to the present invention.
Figure 2B:
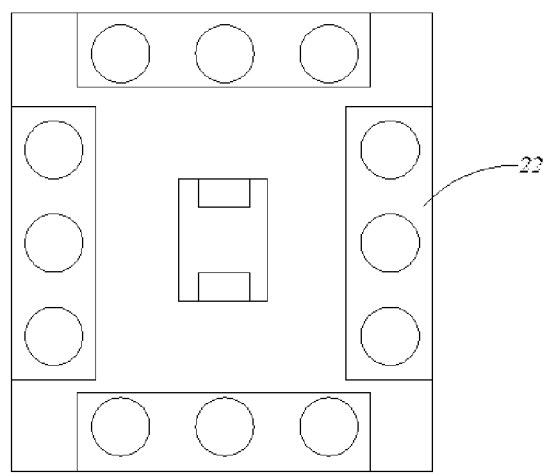

As shown in FIG. 2a and FIG. 2b, the interconnection component 22 is in a plate shape, and has a vacant region 223 for accommodating the inductor 21; or the interconnection component 22 is in a block shape, and a plurality of interconnection components 22 are distributed to surround the inductor 21.

In other implementations of the present invention, the interconnection component 22 may also be subjected to adaptative adjustment according to the quantity, the size, etc, of the inductors 21.

As described above, the components such as the chip 121 can be used as the first package module 1, and the inductor 21 and the interconnection component 22 are used as the second package module 2, two package modules are disposed in a stacked manner to form a stack-like package structure. Then the manufacturing process of the first package module 1 and the second package module 2 can be respectively performed at the same time, so that the production efficiency can be improved.

Figure 3:
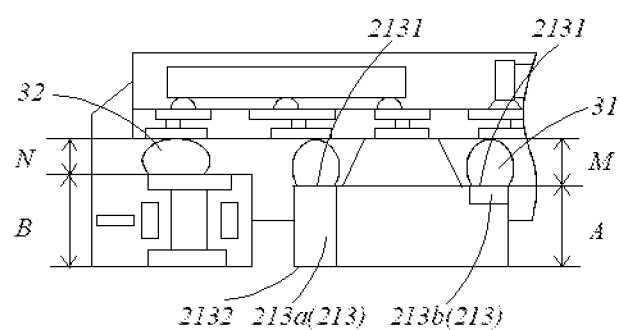
FIG. 3 is a partial schematic diagram of FIG. 1.

Specifically, as shown in FIG. 3, the inductor 21 has A height, and is connected to the first package module 1 by a number of first soldering balls 31, the first soldering bull 31 has M height; the interconnection component 22 has B height, and is connected to the first package module 1 by a number of second soldering balls 32, the second soldering ball 32 has N height, and A+M=B+N.

Herein, by adjusting the consumption of solder paste and being cooperated with soldering balls 3 in the manufacturing process, the soldering balls 3 with different heights are formed on a first surface 221 of the interconnection component and a first surface 211 of the inductor, so that the second surface 212 of the inductor and the second surface 222 of the interconnection component are coplanar, and inductors 21 with different heights can form a flat interconnecting plane, which makes the sequential process such as pasting and mounting can be conveniently performed. The process is simplified, and the reliability of the package structure is improved.

Further, the inductor 21 includes at least one electrode 213 exposed to the first surface 211 of the inductor to form a first bonding pad 2131. The first soldering ball 31 is electrically connected to the first bonding pad 2131. The inductor 21 further includes at least one electrode 213 exposed to the second surface of the inductor 21 to form a second bonding pad 2132. The first bonding pad 2131 is configured to be electrically connected with the first package module 1, and the second bonding pad 2132 is configured to be electrically connected with an external circuit board or electronic device.

Specifically, in this embodiment, the electrode 213 can be positive disposed or inverted, which will be detailed described in following two embodiments.

As shown in FIG. 3, in the embodiment 1, the inductor 21 includes a first electrode 213a and a second electrode 213b. The first electrode 213a and the second electrode 213b are respectively disposed at two sides of the inductor 21. Two ends of the first electrode 213a are respectively exposed to the first surface 211 and the second surface of the inductor 21 to form a first bonding pad 2131 and a second bonding pad 2132. The second electrode 213b is exposed to the first surface 211 of the inductor to form the first bonding pad 2131.

Figure 4:
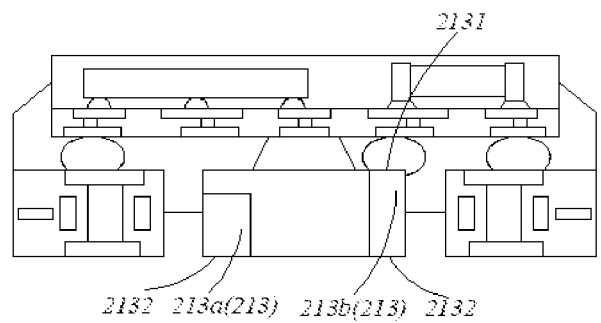
FIG. 4 is a schematic diagram of a package structure with an inductor in embodiment 2 of the present invention.

As shown in FIG. 4, the embodiment 2 is different from embodiment 1. The electrode 213 is inverted. Two ends of the second electrode 213b are respectively exposed to the first surface 211 and the second surface of the inductor 21 to form a first bonding pad 2131 and the second bonding pad 2132, and the first electrode 213a is exposed to the second surface of the inductor 21 to form the second bonding pad 2132.

Herein, the asymmetrical electrode 213 of the inductor 21 also is formed with a soldering pad portion on a horizontal plane, which is convenience for the subsequent pasting and mounting process, and the process is simplified. In other embodiments of the present invention, parameters such as the distribution position and quantity of the electrode 213 can be adjusted according to the specification of the inductor 21.

In some embodiments of the present invention, conductive bumps 23 are further disposed on the second bonding pad 2132 and the second surface of the interconnection component 22. The conductive bumps 23 are conductive structures such as tin caps 23a or bottom soldering balls 23b to further improve the soldering yield between the inductor 21 as well as interconnection component 22 and a circuit board.

Figure 5:
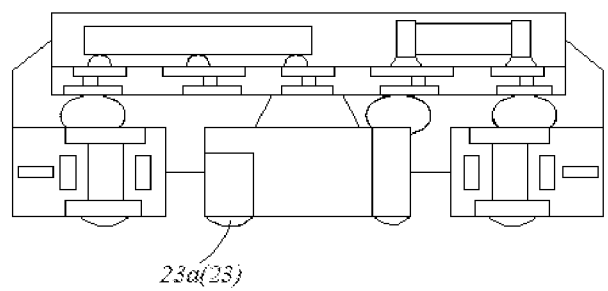
FIG. 5 is a schematic diagram of a package structure with an inductor in embodiment 3 of the present invention.

As shown in FIG. 5, in embodiment 3, the tin caps 23a are respectively formed on the interconnection bonding pad and the second bonding pad.

Figure 6:
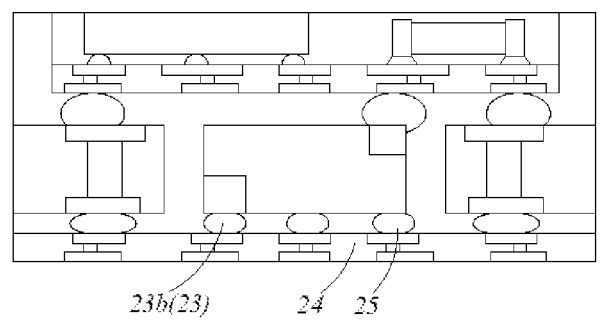
FIG. 6 is a schematic diagram of a package structure with an inductor in embodiment 4 of the present invention.

As shown in FIG. 6, in Embodiment 4, the bottom soldering balls 23b are respectively disposed on the interconnection bonding pad and the second bonding pad, and the interconnection bonding pad and the second bonding pad are electrically connected to the second package carrier 24 by the bottom soldering balls.

Further, at least one support component 25 is disposed between the inductor 21 and the second package carrier 24, the support component 25 is a tin ball or a structural component formed by a composite material, and the support component and the inductor 21 are in insulation connection. In the manufacturing process, the multidimensional support can be provided for the inductor 21 by the support component 25, so that the inductor can be stably disposed on the second package carrier 24, which can improve the defect that the second soldering pad is disposed in a manner of deviating to one side of the inductor 21, and the weight of the other side of the inductor 21 with a large size is out of balance to be inclined to the second package carrier 24 in the manufacturing process.

There are various package relationship between the first package module 1 and the second package module 2 in the present invention to adapt to the size differences therebetween and the differences of process sequences in different embodiments. Several embodiments will be specifically described below.

As shown in FIG. 1a, FIG. 1b, FIG. 4 and FIG. 5, in embodiments 1 to 3, the first package module 1 is provided with a first plastic encapsulation layer 13, and the first plastic encapsulation layer 13 covers the first surface 111 of the first package carrier and the electronic element 12.

The first package module 1 is narrower than the second package module 2. An capillary underfill 4 is filled between the first package module 1 and the second package module 2, and the capillary underfill 4 at least covers the soldering balls 3 and partial side surface of the first package module 1.

The capillary underfill 4 is an organic adhesive mixed with fillers such as SiO2 particles, and can be filled in tiny regions between the first package module 1 and the second package module 2 and between the soldering balls 3, in addition, fixation and protection effects can be achieved on each of the above components after thermal curing, and the problems such as thermomechanical stress caused by heat expansion coefficient mismatch of the first package module 1 and the second package module 2 can be solved.

For the package structure in embodiments 5 and 6, in the production and manufacturing process, a plastic package process can be performed on the first package module 1 while pasting and mounting the inductor 21 and the interconnection component 22, and the capillary underfill 4 is filled after the first package module 1 being placed onto the second package module 2. The filling of the plastic material is omitted for the interconnection component 22 and the inductor 21 with a relatively low reliability requirement, and a region between the first package module 1 and the second package module 2 is filled with the capillary underfill 4, so that the technical flow process can be simplified.

Figure 7A:
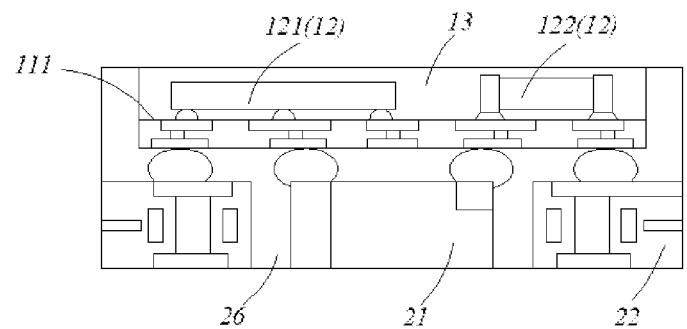
FIG. 7a and FIG. 7b are schematic diagrams of a package structure with an inductor in embodiment 5 of the present invention.

As shown in FIG. 7a, in embodiment 5, the first package module 1 is provided with a first plastic encapsulation layer 13, and the first plastic encapsulation layer 13 covers the first surface 111 of the first package carrier and the electronic element 12. The second package module 2 is further provided with a second plastic encapsulation layer 26. The first package module 1 is narrower than the second package module 2. The second plastic encapsulation layer 26 covers the inductor 21, the interconnection component 22, the soldering balls 3 and the side surface of the first package module 1. The protection on the inductor 21 and the interconnection component 22 is further reinforced by the formation of the second plastic encapsulation layer 26 by filling the plastic material.

The interconnection component 22 is a conductive post and/or at least one layer of conductive circuit coated with the single-layer or multi-layer dielectric material, and the side wall of the second plastic encapsulation layer 26 is coplanar with the side surface of the interconnection component 22.

Figure 7B:
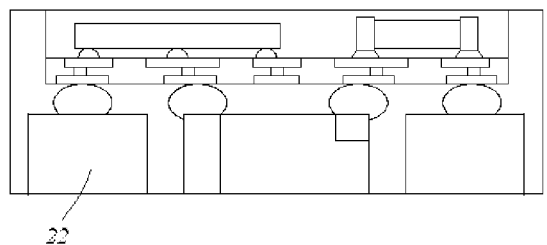

As shown in FIG. 7b, in some other embodiments, when the second plastic encapsulation layer 26 covers the side surface of the interconnection component 22, the interconnection component 22 may also be a conductive post or a conductive block. In addition, it is not limited to this embodiment. When the side surface of the interconnection component 22 is covered by the second plastic encapsulation layer 26, the interconnection component 22 may use a conductive post or a conductive block to enhance the electrical connection and heat dissipation capability. It is not repeated hereafter.

Figure 8:
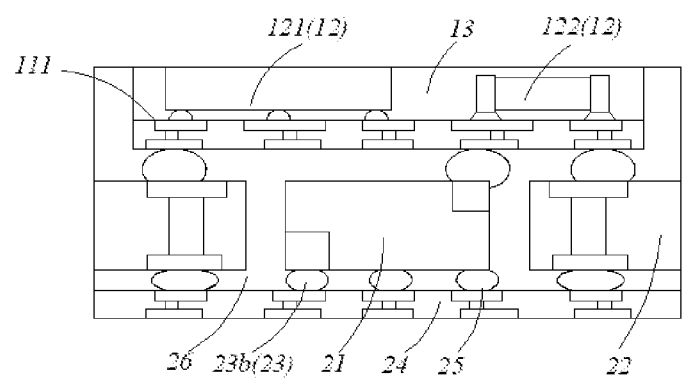
FIG. 8 is a schematic diagram of a package structure with an inductor in embodiment 6 of the present invention.

As shown in FIG. 8, embodiment 6 differs from embodiment 5 in that the second surface of the second package module 2 is also electrically connected with the second package carrier 24 by bottom soldering balls 23b, and the second plastic encapsulation layer 26 also covers one side of the second package carrier 24 facing the second package module 2 and the soldering balls 3 disposed between the second package carrier and the second package module.

Further, the upper surface of the chip 121 may be exposed from the first plastic encapsulation layer 13 so as to facilitate the heat dissipation. In addition, it is not limited to this embodiment, in other embodiments, the first plastic encapsulation layer 13 and/or the second plastic encapsulation layer 26 can be grounded to expose the upper surface of the chip 121.

For the package structure in embodiments 5 and 6, in the manufacturing process, a package process can be performed on the first package module 1 while pasting and mounting the inductor 21 and the interconnection component 22, and the second plastic encapsulation layer 26 is formed by filling after the first package module 1 being placed onto the second package module 2.

Figure 9:
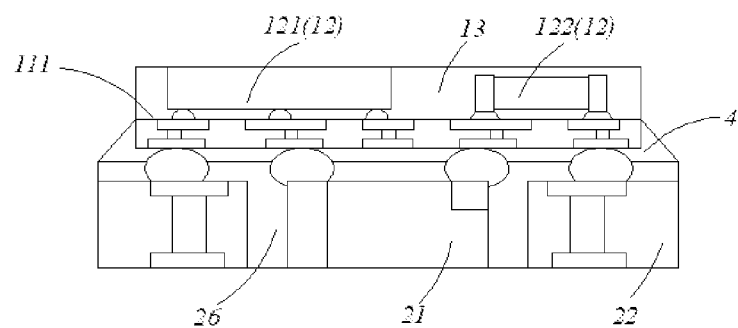
FIG. 9 is a schematic diagram of a package structure with an inductor in embodiment 7 of the present invention.

As shown in FIG. 9, in embodiment 7, the first package module 1 is provided with a first plastic encapsulation layer 13. The first plastic encapsulation layer 13 covers the first surface 111 of the first package carrier and the electronic element 12. The second package module 2 is further provided with a second plastic encapsulation layer 26. The first package module 1 is narrower than the second package module 2, and the second plastic encapsulation layer 26 at least covers the inductor 21 and the interconnection component 22. Capillary underfill 4 is filled between the first package module 1 and the second plastic encapsulation layer 26, and the capillary underfill 4 covers the side edge of the first plastic package carrier 11.

Figure 10:
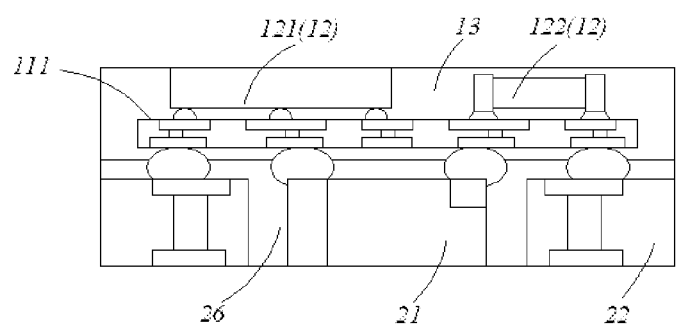
FIG. 10 is a schematic diagram of a package structure with an inductor in embodiment 8 of the present invention.

As shown in FIG. 10, in embodiment 8, the first package module 1 is provided with a first plastic encapsulation layer 13, and the first plastic encapsulation layer 13 covers the first surface 111 of the first package carrier and the electronic element 12. The second package module 2 is further provided with a second plastic encapsulation layer 26, the second plastic encapsulation layer 26 at least covers the inductor 21 and the interconnection component 22. The width of the first package module 1 equals to that of the second package module 2. The first plastic encapsulation layer 13 and the second plastic encapsulation layer 26 cover the soldering balls 3 together, and the side surface of the second plastic encapsulation layer 26 and the side surface of the first plastic encapsulation layer 13 are coplanar.

For the package structure in Embodiments 7 and 8, in the production and manufacturing process, the first package module 1 which is not subjected to plastic package may be placed onto the second package module 2, then, the second package module 2 is subjected to plastic package, and next, the first package module 1 is subjected to plastic package.

Figure 11:
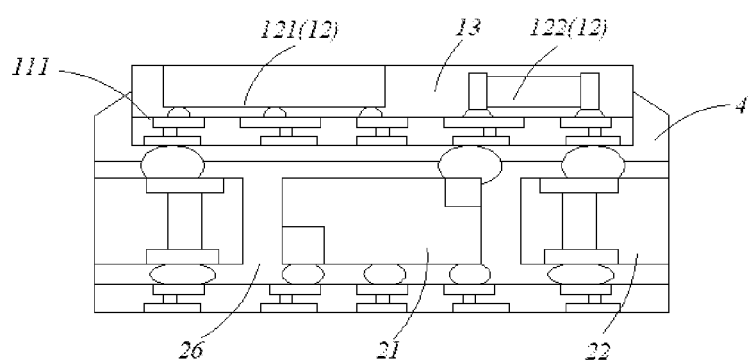
FIG. 11 is a schematic diagram of a package structure with an inductor in embodiment 9 of the present invention.

As shown in FIG. 11, in embodiment 9, the first package module 1 is provided with a first plastic encapsulation layer 13. The first plastic encapsulation layer 13 covers the first surface 111 of the first package carrier and the electronic element 12. The second package module 2 is further provided with a second plastic encapsulation layer 26, the width of the first package module 1 is smaller than that of the second package module 2, and the second plastic encapsulation layer 26 at least covers the inductor 21 and the interconnection component 22. Capillary underfill 4 is filled between the first package module 1 and the second plastic encapsulation layer 26, and the capillary underfill 4 covers the partial side edge of the first package module 1.

The second surface of the second package module 2 is also electrically connected with the second package carrier 24 by the soldering balls 3, the second plastic encapsulation layer 26 also covers one side of the second package carrier 24 facing the second package module 2 and the soldering balls 3 disposed between the second package carrier and the second package module.

Figure 12:
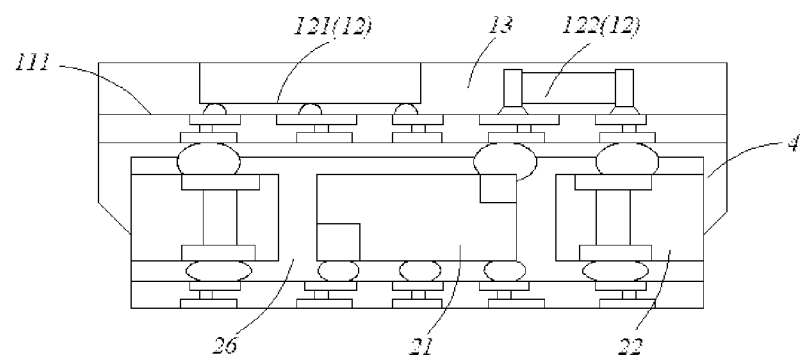
FIG. 12 is a schematic diagram of a package structure with an inductor in embodiment 10 of the present invention.

As shown in FIG. 12, embodiment 10 differs from embodiment 9 in that the width of the first package module 1 is greater than that of the second package module 2, and the capillary underfill 4 covers the partial side edge of the second package module 2.

For the package structure in embodiments 9 and embodiment 10, in the production and manufacturing process, the package can be performed on the first package module 1 and the second package module 2 at the same time, the first package module 1 after being packaged is placed onto the second package module 2 after being packaged. Then, the capillary underfill 4 is filled between the first package module and the second package module.

In some other embodiments, the second package carrier 24 may be omitted.

Figure 13:
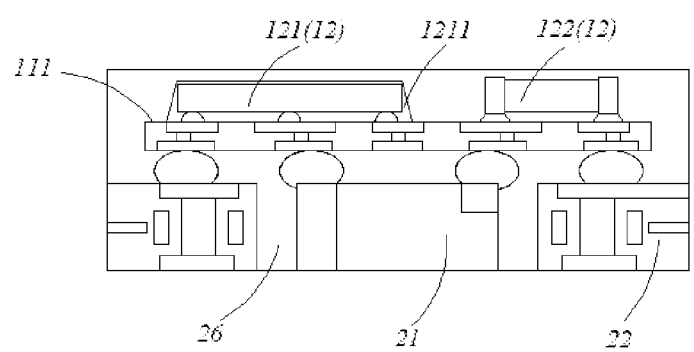
FIG. 13 is a schematic diagram of a package structure with an inductor in embodiment 11 of the present invention.

As shown in FIG. 13, in embodiment 11, the package structure further includes a second plastic encapsulation layer 26, and the second plastic encapsulation layer 26 covers the inductor 21, the interconnection component 22, a first package carrier, the electronic element 12 and the soldering balls 3.

Further, the packaging material 1211 may be filled at the lower side and the peripheral side of the chip 121 so as to protect the chip 121 in the manufacturing process.

Figure 14:
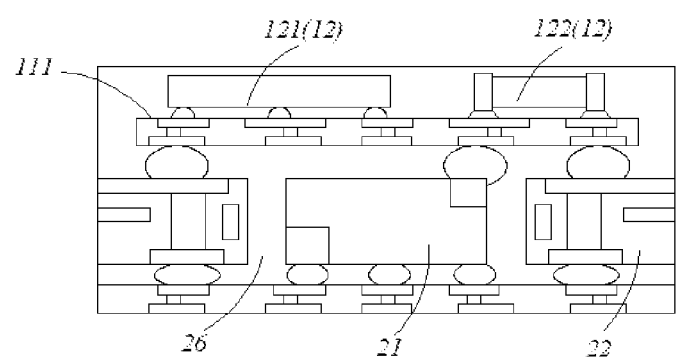
FIG. 14 is a schematic diagram of a package structure with an inductor in embodiment 12 of the present invention.

As shown in FIG. 14, embodiment 12 differs from embodiment 11 in that the second surface of the second package module 2 is also electrically connected with the second package carrier 24 by the soldering balls 3. The second plastic encapsulation layer 26 also covers one side of the second package carrier 24 facing the second package module 2 and the soldering balls 3 disposed between the second package carrier and the second package module.

In embodiment 11 and embodiment 12, in the manufacturing process, the first package module 1 before packaging can be placed onto the second package module 2 firstly, then packaging the first package module and the second package module at the same time.

Of course, the feature parameters such as the package method, the fixing relationship and the size of the first package module 1 and the second package module 2 are not limited to the manners described in the above embodiments, and may be adaptively adjusted according to the practical package structure as long as the first package module 1 is stacked on the second package module 2.

Further, in some embodiments of the present invention, an outer surface of the first package module 1 is covered with a shielding film 5, and the shielding film 5 at least covers an upper surface of the first package module 1, so as to provide electromagnetic protection for the electronic element 12 in the first package module 1.

Specifically, the shielding film 5 is a sputtering sandwich layer metal film material such as copper, stainless steel and titanium, or a conductive composite material such as conductive resin of silver/copper-containing high-density metal packings, or a combination of at least two of the above materials as long as it can achieve an effect of shielding or adsorbing electromagnetic waves.

In some embodiments of the present invention, the metal shielding layer 5 may include a bonding layer attached to the first package module 1 and a protection layer exposed to the air. The bonding layer is a high-adhesion metal material such as copper, or a high-adhesion organic material so as to enhance the bonding intensity between the shielding film 5 and the first package module 1. The protection layer is a stainless steel (7% NiV) or CrCu alloy layer, or an organic damp-resistant layer, etc. to further enhance the reliability of the package structure under the high-humidity condition.

In the present invention, the shielding film 5 is connected with a grounding wire in the interconnection component 22 to improve the electromagnetic shielding effect. Specifically, the connecting manner of the shielding film 5 and the interconnection component 22 is specifically illustrated by taking some embodiments as examples.

Figure 15:
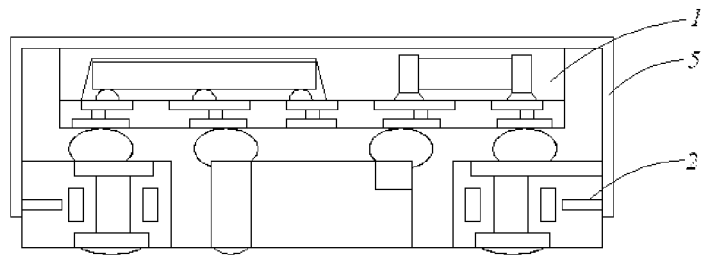
FIG. 15 is a schematic diagram of a package structure with an inductor in embodiment 13 of the present invention.
Figure 16:
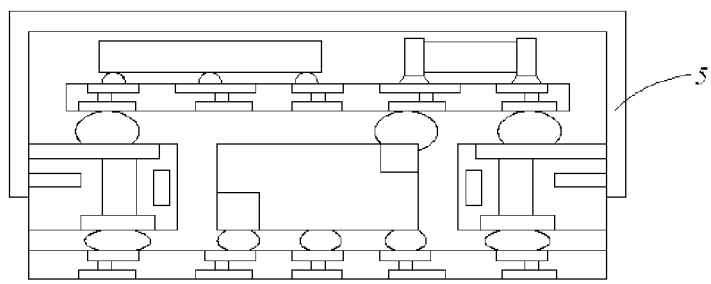
FIG. 16 is a schematic diagram of a package structure with an inductor in embodiment 14 of the present invention.

As shown in FIG. 15 and FIG. 16, embodiments 13 and 14 respectively differ from embodiments 11 and 12 in that the shielding film 5 covers the upper surface of the first package module 1, the shielding film 5 also covers the side surface of the first package module 1, and extends to cover the side surface of the second package module 2 to be electrically connected with the third bonding pad of the interconnection component 22 to realize grounding. The third bonding pad is exposed to the side surface of the second package module 2.

In some other embodiments, the other package and fixing manners may also be adopted between the first package module 1 and the second package module 2 as long as the continuous plastic encapsulation layers are formed on the upper surfaces and the side surfaces of the first package module 1 and the second package module 2 to plate and cover the shielding film 5, and the interconnection component 22 is exposed to the side surface of the second plastic encapsulation layer 26 to be connected with the shielding film 5.

Figure 17:
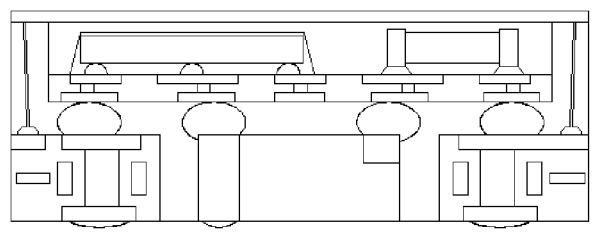
FIG. 17 is a schematic diagram of a package structure with an inductor in embodiment 15 of the present invention.

As shown in FIG. 17, embodiment 15 differs from embodiment 13 in that a metal wire or metal post is disposed in the second plastic encapsulation layer 26 on the peripheral side of the first package module 1, and the metal wire or the metal post is electrically connected to the interconnection component 22 and the shielding film 5 covering the upper surface of the first package module 1 respectively, so that the grounding of the shielding film 5 can be realized by the metal wire or the metal post.

Figure 18:
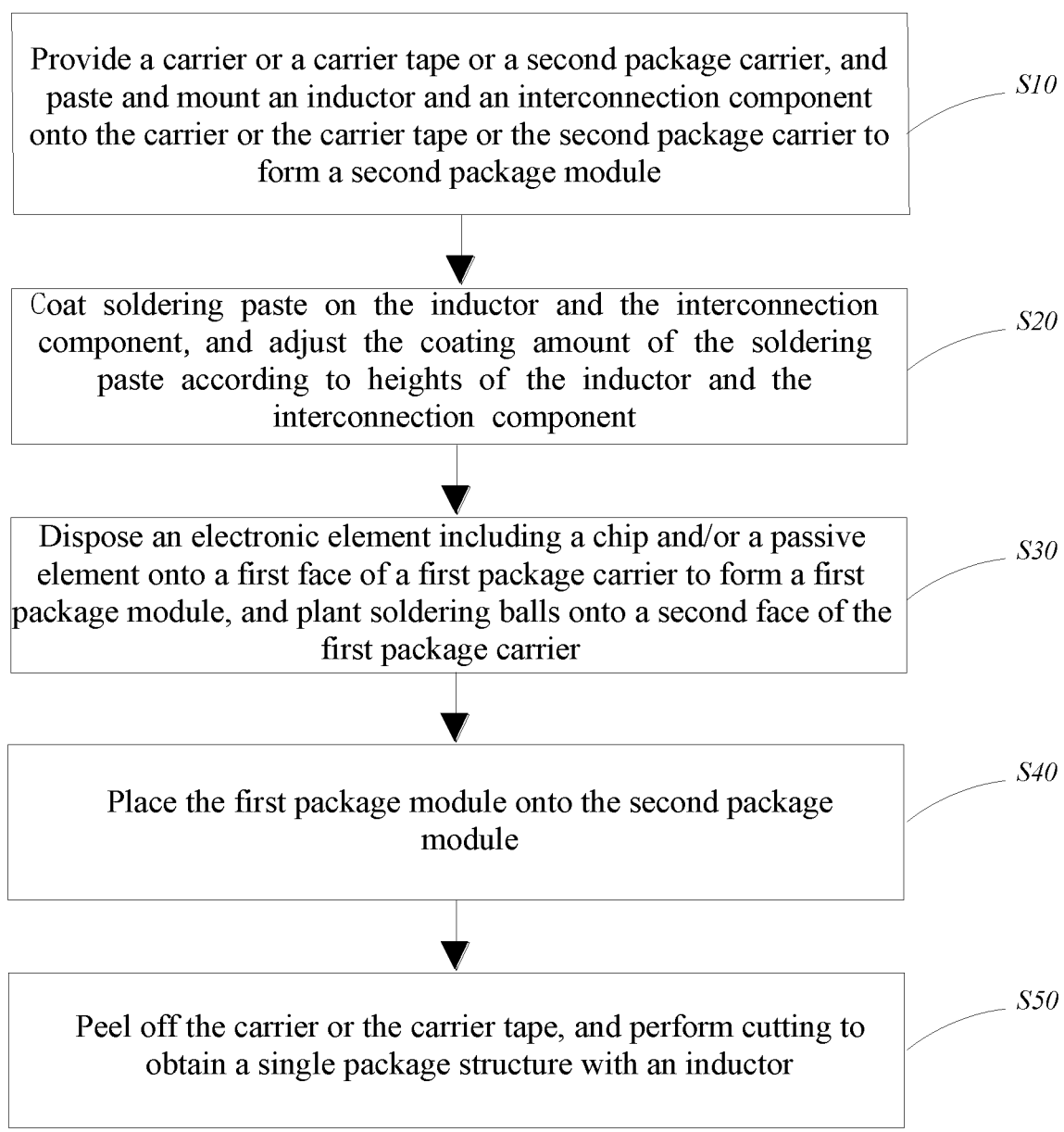
FIG. 18 is a schematic flowchart of a manufacturing method of a package structure with an inductor in an embodiment of the present invention.
Figure 19:
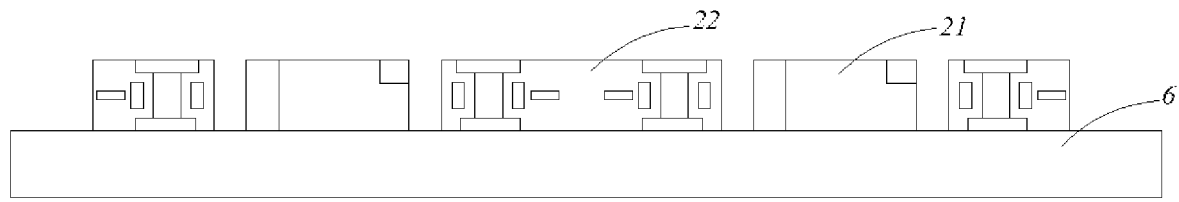
FIG. 19 to FIG. 22 are schematic diagrams of a manufacturing method of a package structure with an inductor in an embodiment of the present invention.

As shown in FIG. 18, the present invention further provides a manufacturing method of a package structure with an inductor 21, and the manufacturing method includes the following steps:

S10: as shown in FIG. 19, a carrier 6 or a carrier tape or a second package carrier 24 is provided, and an inductor 21 and an interconnection component 22 are pasted and mounted onto the carrier or the carrier tape or the second package carrier to form a second package module 2.

A carrier 6 or a carrier tape or a second package carrier 24 has a flat upper surface so that the inductor 21 and the interconnection component 22 pasted and mounted onto the carrier or the carrier tape or the second package carrier can be coplanar.

Specifically, the operation of pasting and mounting the interconnection component 22 specifically includes: a vacant region 223 for accommodating the inductor 21 is formed in the plate-shaped interconnection component 22. The interconnection component 22 is pasted and mounted onto the carrier or the carrier tape or the second package carrier 24, and the inductor 21 is disposed in the vacant region 223 in an in-position manner. Or, the interconnection component 22 in a block shape is pasted and mounted onto the carrier or the carrier tape or the second package carrier 24, and the interconnection component 22 is distributed to surround the inductor 21.

More specifically, the operation of pasting and mounting the inductor 21 and the interconnection component 22 onto the second package carrier 24 includes: conductive bumps 23 are formed on the inductor 21 and the interconnection component 22, a plurality of support components 25 are disposed on the second surface of the inductor 21, and the inductor 21 and the interconnection component 22 are disposed on the second package carrier 24 by the conductive bumps 23 and the support components 25.

Figure 20:
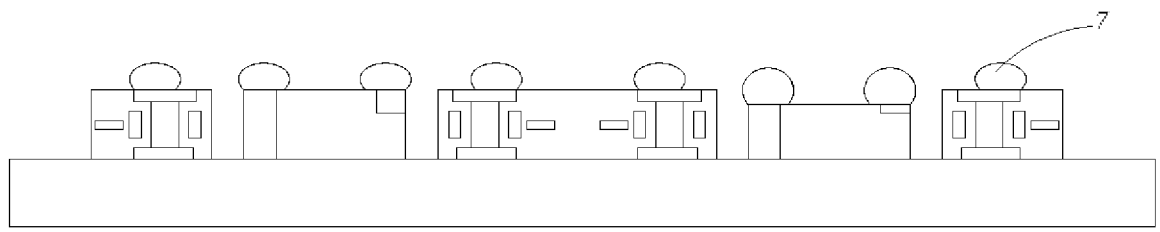

S20: as shown in FIG. 20, solder paste 7 is coated on the inductor 21 and the interconnection component 22, and the coating amount of the solder paste 7 can be adjusted according to the heights of the inductor 21 and the interconnection component 22.

Specifically, much solder paste 7 is coated on the inductor 21 with a low height, so as to continuously realize reflow soldering with the soldering balls 3 in a subsequent process to form fixed connection.

Figure 21:
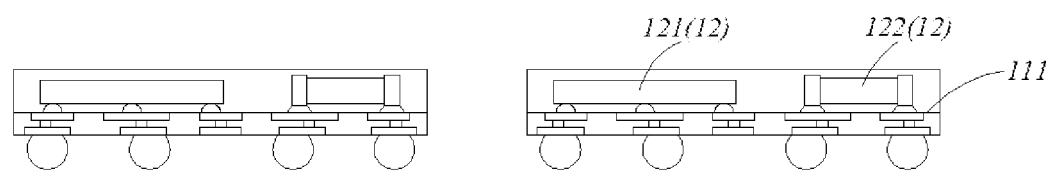

S30: as shown in FIG. 21, an electronic element 12 including a chip 121 and/or a passive component 122 is disposed onto a first surface 111 of a first package carrier to form a first package module 1, and the soldering balls 3 are planted onto a second surface 112 of the first package carrier.

It should be noted that there is no sequential order among steps S30, S10 and S20, and these steps may be synchronously performed to improve the production efficiency.

Figure 22:
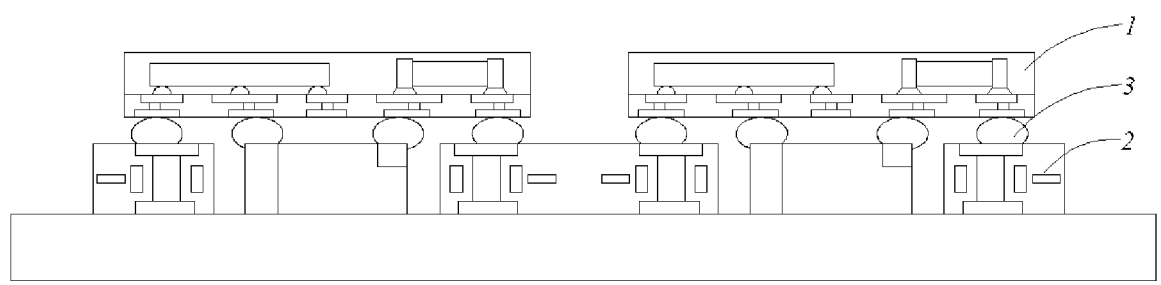

S40: as shown in FIG. 22, the first package module 1 is placed on the second package module 2.

By reflow soldering, the first package module 1 is fixed to the second package module 2 by the soldering balls 3 and the solder paste.

S50: peeling the carrier or the carrier tape, and cutting is performed to obtain the single package structure with an inductor 21.

Specifically, in the present invention, there are many plastic package and fixing manners between the first package module 1 and the second package module 2. Some embodiments will be specifically descried hereafter.

Figure 23:
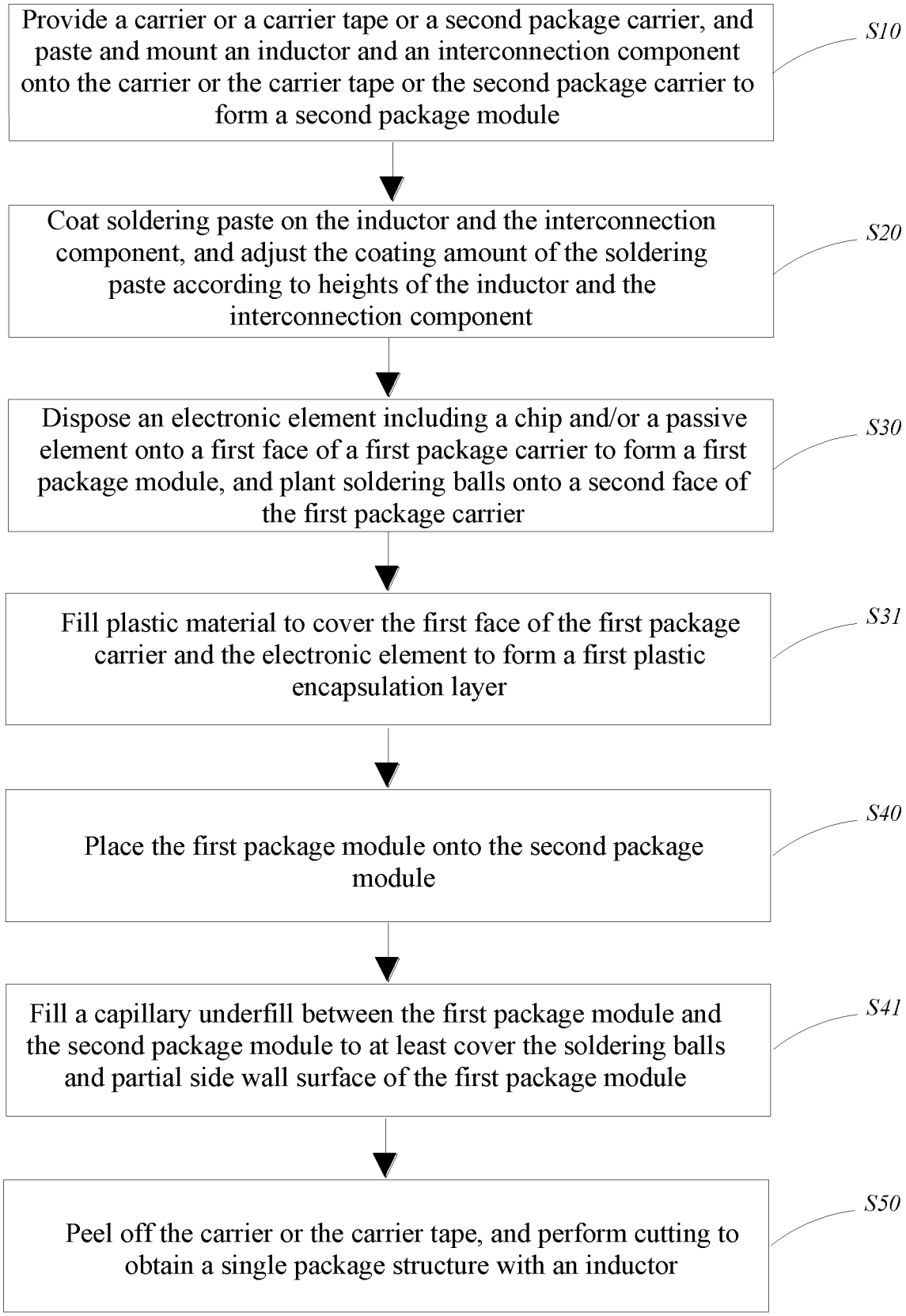
FIG. 23 is a schematic flowchart of a manufacturing method of a package structure with an inductor in embodiment 16 of the present invention.

As shown in FIG. 23, in embodiment 16, before S40, S31 is further included.

S31: plastic material is filled to cover the first surface 111 of the first package carrier and the electronic element 12 to form a first plastic encapsulation layer 13.

After S40, S41 is also included.

Figure 24:
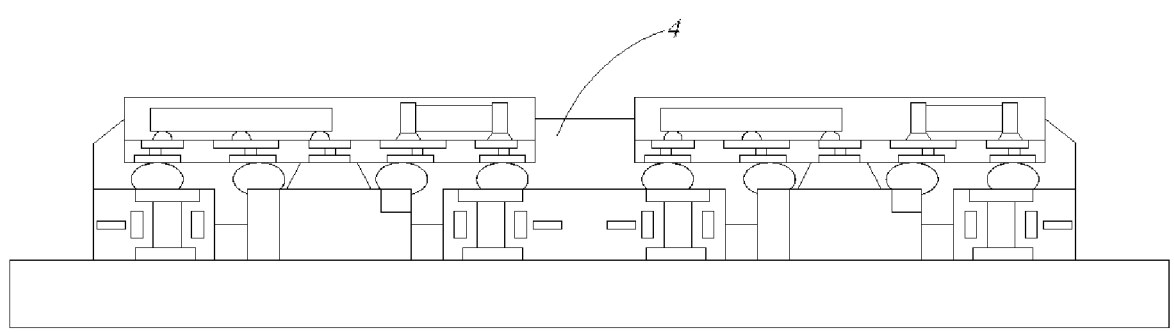
FIG. 24 is a schematic diagram of step S41 in Embodiment 16 of the present invention.

S41: as shown in FIG. 24, a capillary underfill 4 is filled between the first package module 1 and the second package module 2 to at least cover the soldering balls 3 and the partial side surface of the first package module 1.

Figure 25:
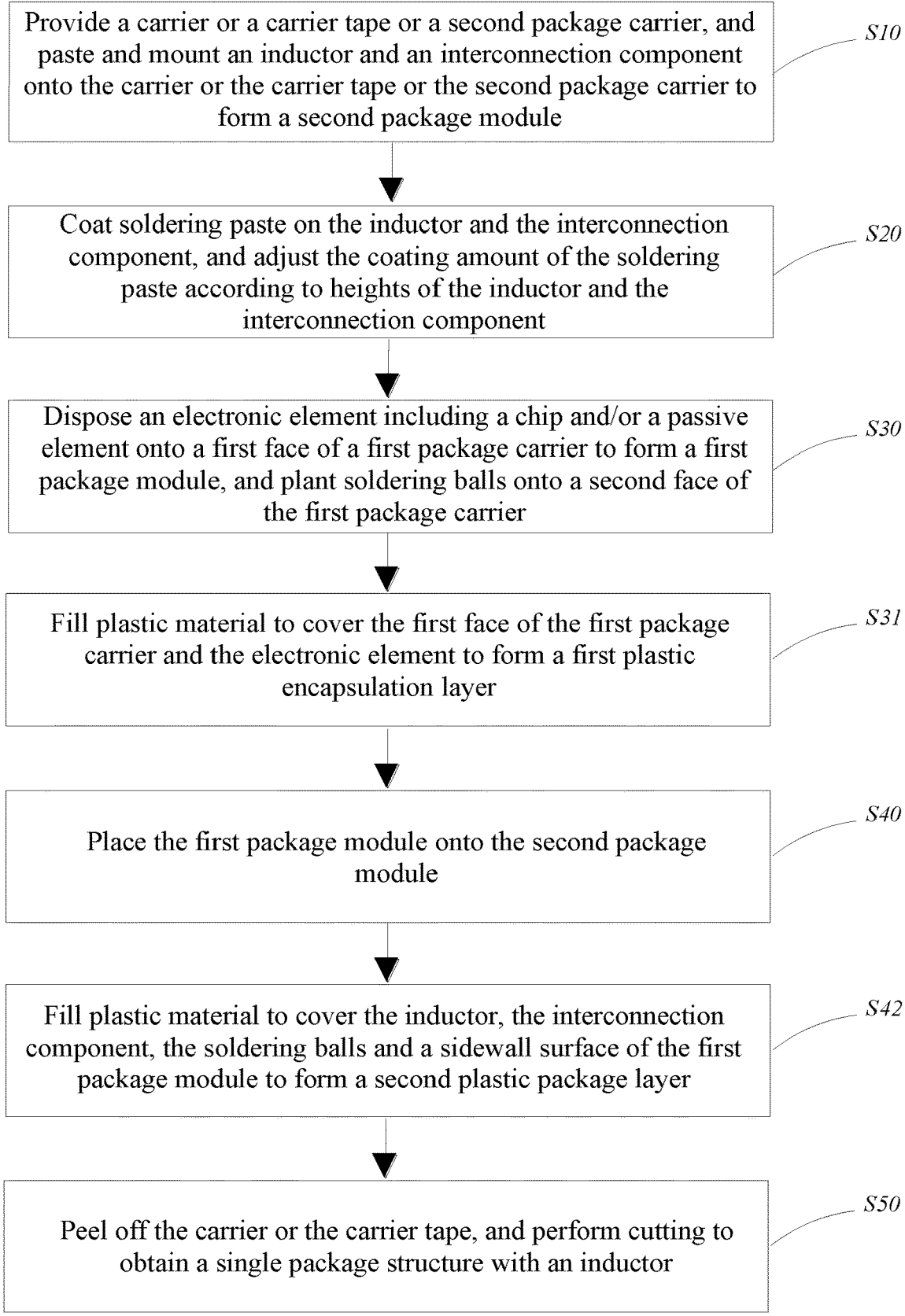
FIG. 25 is a schematic flowchart of a manufacturing method of a package structure with an inductor in embodiment 17 of the present invention.

As shown in FIG. 25, embodiment 17 differs from embodiment 16 in that after S40, S42 is performed.

Figure 26:
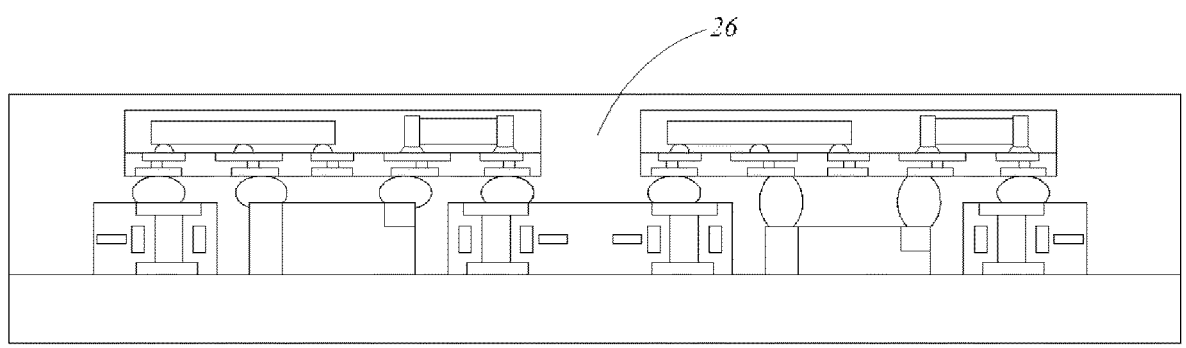
FIG. 26 is a schematic diagram of step S42 in Embodiment 17 of the present invention.

S42: as shown in FIG. 26, plastic material is filled to cover the inductor 21, the interconnection component 22, the soldering balls 3 and the side surface of the first package module 1 to form a second plastic encapsulation layer 26.

Figure 27:
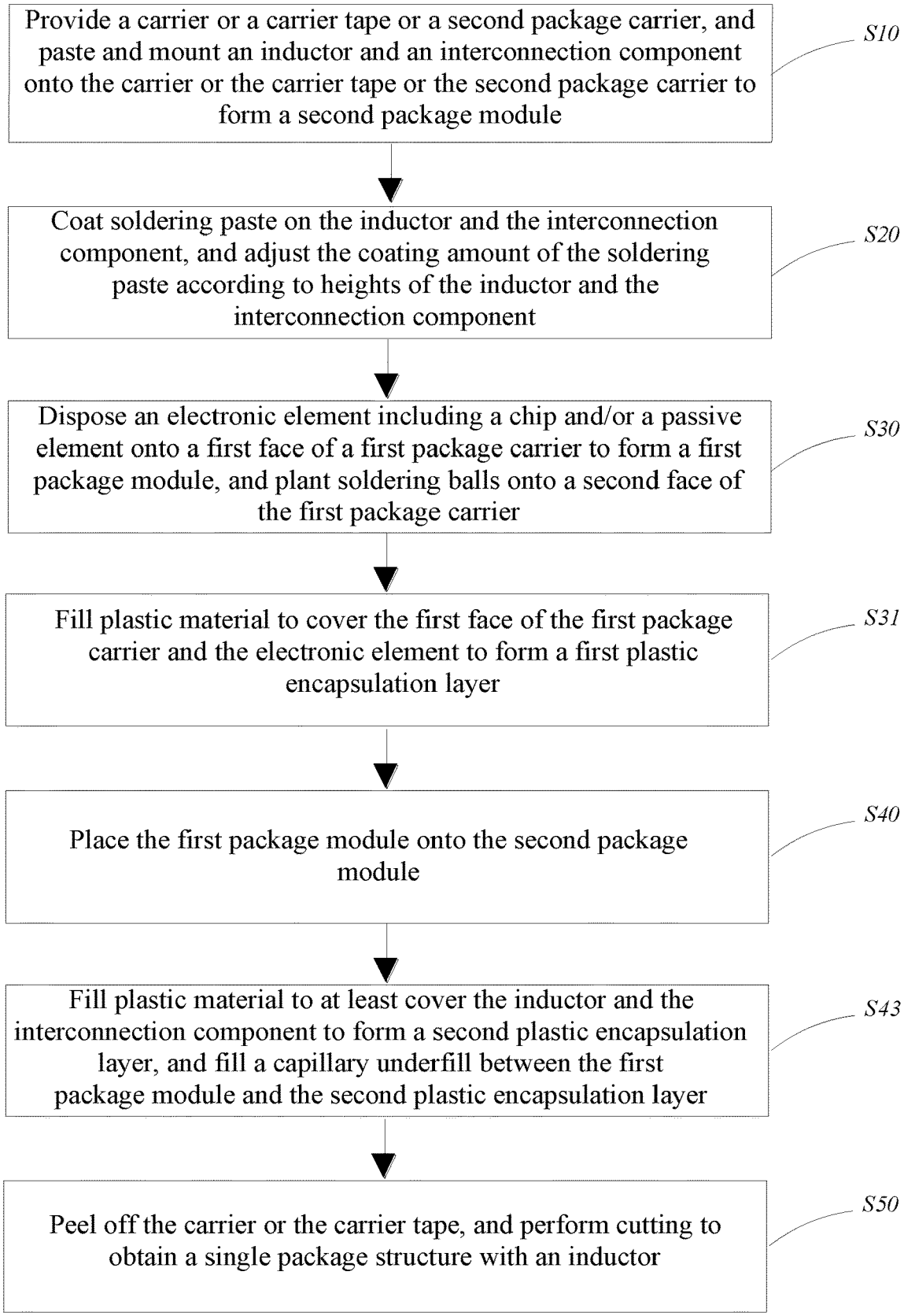
FIG. 27 is a schematic flowchart of a manufacturing method of a package structure with an inductor in embodiment 18 of the present invention.

As shown in FIG. 27, embodiment 18 differs from embodiment 16 in that after S40, S43 is performed.

S43: the plastic material is filled to at least cover the inductor 21 and the interconnection component 22 to form a second plastic encapsulation layer 26, and capillary underfill 4 is filled between the first package module 1 and the second plastic encapsulation layer 26.

Specifically, according to size differences between the first package module 1 and the second package module 2, the capillary underfill 4 may cover the partial side edge of the first package module 1 or the side edge of the partial second package module 2.

Figure 28:
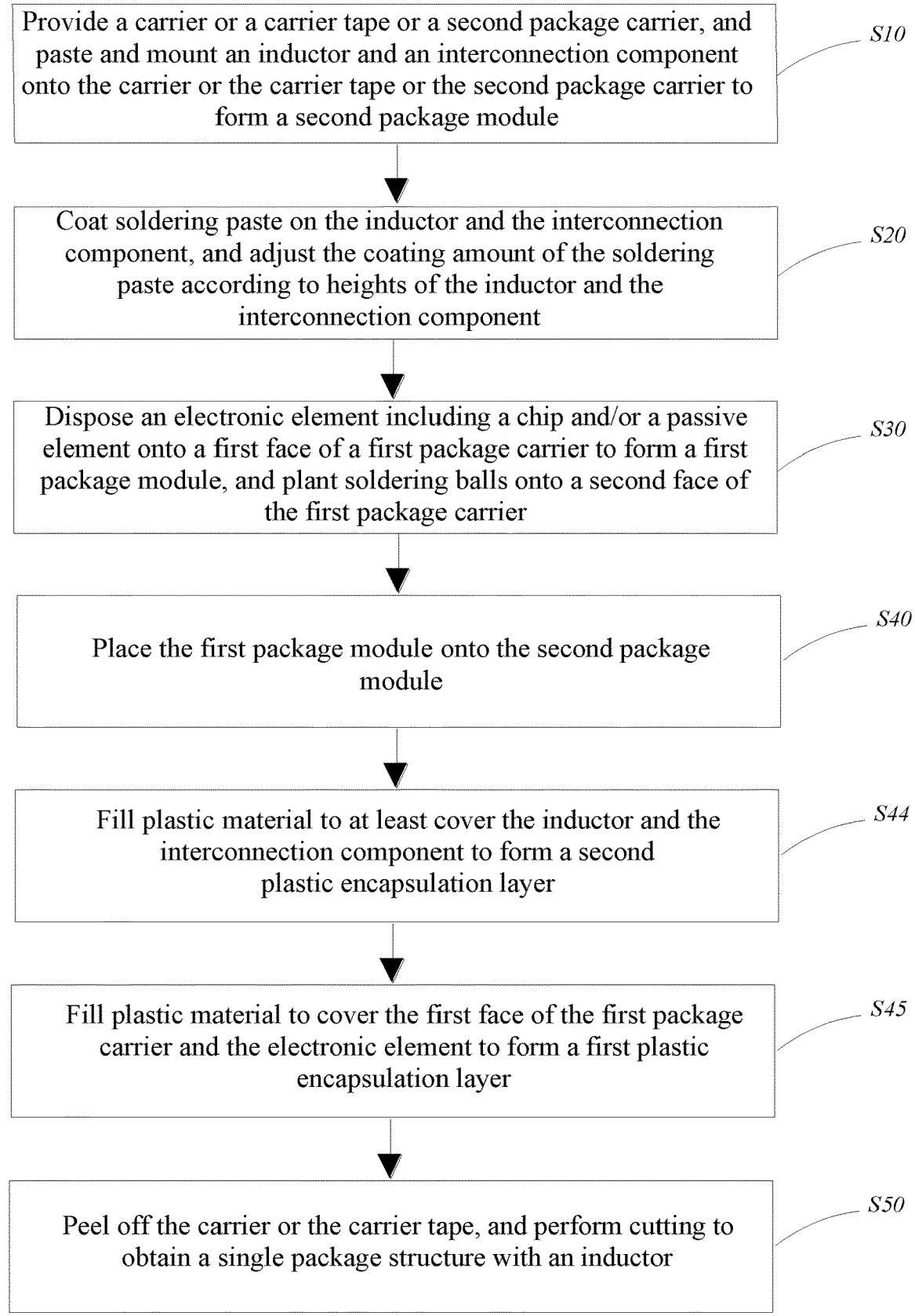
FIG. 28 is a schematic flowchart of a manufacturing method of a package structure with an inductor in embodiment 19 of the present invention.

As shown in FIG. 28, in embodiment 19, after S40, S44 and S45 are further included.

S44: the plastic material at least covers the inductor 21 and the interconnection component 22 to form the second plastic encapsulation layer 26.

S45: the plastic material is filled to cover the first surface 111 of the first package carrier and the electronic element 12 to form a first plastic encapsulation layer 13.

Further, in some embodiments of this embodiment, the following steps are further included: the first plastic encapsulation layer 13 and the second plastic encapsulation layer 26 are thinned in manners such as a mechanical manner or a laser manner, or the first package module 1 is fixed onto the second package module 2 by the capillary underfill 4, and then, plastic package is performed to form the first plastic encapsulation layer 13.

Figure 29:
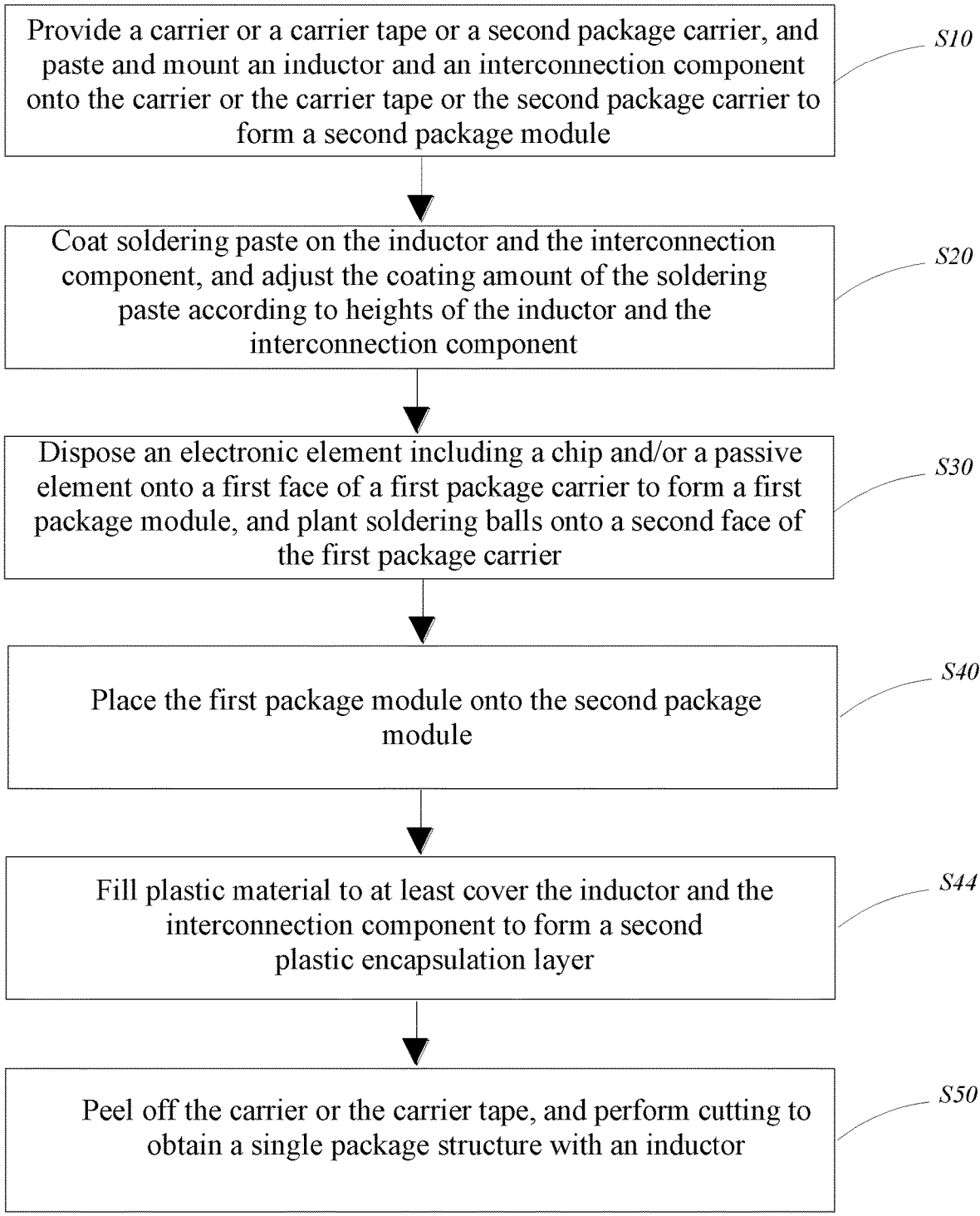
FIG. 29 is a schematic flowchart of a manufacturing method of a package structure with an inductor in embodiment 19 of the present invention.

As shown in FIG. 29, in embodiment 20, after S40, S46 is further included.

S46: the plastic material is filled to cover the inductor 21, the interconnection component 22, a first package carrier, the electronic element 12 and the soldering balls 3 to form a second plastic encapsulation layer 26.

In some embodiments of the present invention, the following steps are further included: a shielding film 5 is plated and covered onto the first package module 1, and the shielding film 5 at least covers an upper surface of the first package module 1, and extends to a side surface of the second package module 2, and is electrically connected with a third bonding pad of the interconnection component 22 exposed to the side surface of the second package module 2. Or, a metal wire or metal post connected to the interconnection component 22 is disposed on the peripheral side of the first package module 1, and the shielding film 5 connected to the metal wire or the metal post is plated and covered on the first package module 1.

Based on the above, the inductor and the interconnection component are used as an second package module, and stacked with other components such as the first package module to form a stack-like package structure. The first package module is provided with other electronic elements. Then the first and second package modules can be synchronously subjected to package manufacturing, which improves the production efficiency. Additionally, the soldering balls with different heights are formed on the first faces of the interconnecting structural component and the inductive device by adjusting the consumption of soldering paste, which make the second faces of the inductor and the interconnection component are coplanar, then inductor with different heights can form a flat interconnecting plane, which makes the sequential process such as pasting and mounting can be conveniently performed. The process is simplified, and the reliability of the package structure is improved.

It should be understood that, although this specification is described in terms of embodiments, it is not indicated that each embodiment only includes one independent technical solution, this description manner of the specification is merely for the sake of clarity, those skilled in the art shall regard the specification as a whole, technical solutions in each embodiment may also be suitably combined to form that other embodiments which can be understood by those skilled in the art.

A series of detailed descriptions listed above are illustrated only for feasible embodiments of the present invention, and are not intended to limit the protection scope of the present invention, and equivalent embodiments or modifications made without departing from the technical spirits of the present invention should all be included in the protection scope of the present invention.

What is claimed is:

1. A package structure with an inductor, comprising:
a first package module having a first package carrier and an electronic element, the package carrier having a first surface and a second surface opposite to each other, the electronic element being disposed on the first surface of the first package carrier, and the first package carrier being electrically connected to a second package module by soldering balls disposed on the second surface; and a second package module stacked below the first package module, the second package module comprising the inductor and an interconnection component, each of the inductor and the interconnection component having a first surface and a second surface opposite to each other, the inductor and the interconnection component being electrically connected with each other by the soldering balls on the first surface thereof and the first package carrier, and the second surfaces of the inductor and the interconnection component being coplanar, wherein the first package module is provided with a first plastic encapsulation layer, and the first plastic encapsulation layer covers the first surface of the first package carrier and the electronic element, and wherein the first package module is narrower than the second package module, a capillary underfill is filled between the first package module and the second package module, and the capillary underfill at least covers the soldering balls and partial side surface of the first package module.

2. The package structure with an inductor according to claim 1, wherein the inductor has A height, and is connected to the first package module by a first soldering ball, the first soldering ball has M height; the interconnection component has B height, and is connected to the first package module by a second soldering ball, the second soldering ball has N height, and A+M=B+N.

3. The package structure with an inductor according to claim 1, wherein the inductor comprises at least one electrode exposed to the first surface of the inductor to form a first bonding pad, the first soldering ball is electrically connected to the first bonding pad, and the inductor further comprises at least one electrode exposed to the second surface of the inductor to form a second bonding pad.

4. The package structure with an inductor according to claim 3, wherein the second bonding pad and the second surface of the interconnection component are provided with conductive bumps.

5. The package structure with an inductor according to claim 4, wherein the second bonding pad and the second surface of the interconnection component are electrically connected to a second package carrier, at least one support component is disposed between the inductor and the second package carrier, and the support component and the inductor are in insulation connection.

6. The package structure with an inductor according to claim 1, wherein the second package module is further provided with a second plastic encapsulation layer, the first package module is narrower than the second package module, and the second plastic encapsulation layer covers the inductor, the interconnection component, the soldering balls and a side surface of the first package module.

7. The package structure with an inductor according to claim 6, wherein a metal wire or a metal post is disposed in the second plastic encapsulation layer surrounding the first package module, and the metal wire or the metal post electrically connects with the interconnection component and the shielding film covering the upper surface of the first package module.

8. The package structure with an inductor according to claim 1, wherein the second package module is further provided with a second plastic encapsulation layer, the second plastic encapsulation layer at least covers the inductor and the interconnection component, and a capillary underfill is filled between the first package module and the second plastic encapsulation layer.

9. The package structure with an inductor according to claim 1, wherein the second package module is further provided with a second plastic encapsulation layer, the second plastic encapsulation layer at least covers the inductor and the interconnection component, the width of the first package module and that of the second package module are equal, the first plastic encapsulation layer and the second plastic encapsulation layer cover the soldering balls together, and side surfaces of the second plastic encapsulation layer and the first plastic encapsulation layer are coplanar.

10. The package structure with an inductor according to claim 1, wherein the package structure further comprises a second plastic encapsulation layer, the second plastic encapsulation layer covers the inductor, the interconnection component, the first package carrier, the electronic element and the soldering balls.

11. The package structure with an inductor according to claim 1, wherein there is a shielding film covering the outer side of the first package module, and the shielding film at least covers the upper side of the first package module.

12. The package structure with an inductor according to claim 11, wherein the shielding film further covers a side surface of the first package module, and extends to a side surface of the second package module, and electrically connects with a number of third bonding pads of the interconnection component, the third bonding pads are exposed to the side surface of the second package module.

13. The package structure with an inductor according to claim 11, wherein a metal wire or a metal post is disposed in the second plastic encapsulation layer surrounding the first package module, and the metal wire or the metal post electrically connects with the interconnection component and the shielding film covering the upper surface of the first package module.

14. The package structure with an inductor according to claim 1, wherein the interconnection component is a conductive post, or a conductive post enclosed by insulative material and/or a conductive circuit, and a plurality of interconnection bonding pads are provided at the first surface of the interconnection component and the second surface of the interconnection component.

15. The package structure with an inductor according to claim 14, wherein the interconnection component is in a plate shape, and has a vacant region for receiving the inductor; or the interconnection component is in a block shape, and a plurality of interconnection components are distributed to surround the inductor.

16. A manufacturing method of a package structure with an inductor, comprising the following steps: providing a carrier or a carrier tape or a second package carrier, and pasting and mounting the inductor and an interconnection component onto the carrier or the carrier tape or the second package carrier to form a second package module; coating solder paste on the inductor and the interconnection component, and adjusting the coating amount of the solder paste according to the heights of the inductor and the interconnection component; disposing an electronic element provided with a chip and/or a passive component onto a first surface of a first package carrier to form a first package module, and planting soldering balls onto a second surface of the first package carrier; placing the first package module onto the second package module, and performing reflow soldering; and peeling off the carrier or the carrier tape, and performing cutting to obtain a single package structure with the inductor; filling a plastic material to cover the first surface of the first package carrier and the electronic element to form a first plastic encapsulation layer; applying capillary underfill between the first package module and the second package module to at least cover the soldering balls and partial side surface of the first package module.

17. The manufacturing method of the package structure with an inductor according to claim 16, further comprising the following steps:
   filling plastic material to cover the inductor, the interconnection component, the soldering balls and a side surface of the first package module to form a second plastic encapsulation layer.

18. The manufacturing method of the package structure with an inductor according to claim 16, further comprising the following steps:
   filling plastic material to at least cover the inductor and the interconnection component to form a second plastic encapsulation layer, and applying capillary underfill between the first package module and the second plastic encapsulation layer.

19. The manufacturing method of the package structure with an inductor according to claim 16, further comprising the following steps:
   filling plastic material to cover the inductor, the interconnection component, a first package carrier, the electronic element and the soldering balls to form a second plastic encapsulation layer.

20. The manufacturing method of the package structure with an inductor according to any one of claim 16, further comprising the following steps:
   plating a shielding film onto the first package module, wherein the shielding film at least covers the upper side of the first package module, and extends to cover the side surface of the second package module, and electrically connects with a number of third bonding pads of the interconnection component, the third bonding pads are exposed to the side surface of the second package module.

21. The manufacturing method of the package structure with an inductor according to any one of claim 16, further comprising the following steps:
   disposing a metal wire or a metal post at the peripheral side of the first package module, connecting the metal wire or metal post with the interconnection component, and then plating a shielding film onto the first package module and making the shielding film connect with the metal wire or the metal post.

22. The manufacturing method of the package structure with an inductor according to claim 16, wherein the pasting and mounting the interconnection component specifically comprises:
   forming a vacant region in the plate-shaped interconnection component, pasting and mounting the interconnection component onto the carrier or the carrier tape or the second package carrier, and disposing the inductor in the vacant region.

23. The manufacturing method of the package structure with an inductor according to claim 16, wherein the pasting and mounting the interconnection component specifically comprises:
   pasting and mounting the interconnection component in a block shape onto the carrier or the carrier tape or the second package carrier, and the interconnection component surrounds the inductor.

24. The manufacturing method of the package structure with an inductor according to claim 16, wherein the pasting and mounting the inductor and the interconnection component onto the second package carrier specifically comprises:
   forming conductive bumps on the inductor and the interconnection component, disposing a plurality of support components on the second surface of the inductor, and disposing the inductor and the interconnection component onto the second package carrier, and connecting the inductor and the interconnection component with the second package carrier by the conductive bumps and the support components.

* * * * *